United States Patent
Wang

(10) Patent No.: US 8,207,755 B1
(45) Date of Patent: Jun. 26, 2012

(54) LOW LEAKAGE POWER DETECTION CIRCUIT

(75) Inventor: Wen-Han Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/027,419

(22) Filed: Feb. 15, 2011

(51) Int. Cl.
*H03K 19/094* (2006.01)

(52) U.S. Cl. ............................. 326/81; 326/27; 326/68

(58) Field of Classification Search .................. 326/21, 326/26–28, 63, 68, 70, 71, 80–82
See application file for complete search history.

(56) References Cited

U.S. PATENT DOCUMENTS

| | | | | |
|---|---|---|---|---|
| 5,828,231 A | * | 10/1998 | Bazargan | 326/81 |
| 6,897,688 B2 | * | 5/2005 | Lee et al. | 327/112 |
| 7,560,971 B2 | | 7/2009 | Heikkila et al. | |
| 2002/0033703 A1 | * | 3/2002 | Yu et al. | 324/551 |
| 2007/0139096 A1 | * | 6/2007 | Kim et al. | 327/525 |
| 2008/0084775 A1 | * | 4/2008 | Hoberman et al. | 365/227 |
| 2009/0295770 A1 | * | 12/2009 | Woo et al. | 345/208 |

* cited by examiner

*Primary Examiner* — Don Le
(74) *Attorney, Agent, or Firm* — Slater & Matsil, L.L.P.

(57) ABSTRACT

A leakage current reduction circuit comprising a transmission gate, a feedback channel and a controller is placed between a first device supplied with a first voltage potential and a second device supplied with a second voltage potential. The voltage potential mismatch between the first device and the second device may cause a leakage current flowing through the input stage of the second device. By employing the low leakage power detection circuit, a logic high state generated from the first device can be converted into a logic high state having an amplitude approximately equal to the second voltage potential.

20 Claims, 4 Drawing Sheets

US 8,207,755 B1

LOW LEAKAGE POWER DETECTION CIRCUIT

BACKGROUND

A variety of battery powered portable devices, such as mobile phones, notebook computers and the like, have become popular. Each portable device may employ a plurality of integrated circuits. Each integrated circuit may comprise a large number of transistors. During an active mode, the change of logic state causes a plurality of charge and discharge processes across the gate of a transistor and corresponding change in the voltage across the output parasitic capacitor of the transistor. An amount of energy dissipated during the logic state change described above is unavoidable because of the physical characteristics of a transistor. On the other hand, leakage current is a major power loss when an integrated circuit is in an idle mode. The leakage current of an integrated circuit may result from a variety of reasons. However, a good design can reduce leakage current power consumption so as to extend battery life.

Electronic devices such as a computer may be powered up in accordance with a specific power up sequence. For example, a computer's peripheral devices may be powered up earlier than its core device. The early ramp-up of the peripheral devices may cause a logic state wherein the high voltage for the peripheral devices is on and the low voltage for the core device is off. Alternatively, when the computer enters a power saving mode, the system management unit of the computer may shut down some low voltage rails so as to save power consumption. Under either situation, some logic devices are not set to a fixed logic state. As a result, leakage current may be induced accordingly.

Furthermore, other factors may contribute to leakage current in integrated circuits. A direct path between an N-type Metal Oxide Semiconductor (NMOS) transistor and a P-type Metal Oxide Semiconductor (PMOS) transistor connected in series is a major source of leakage current. For example, in an integrated circuit having two voltage levels. That is, a high voltage level (e.g., 3.3V) is used to power Input/Output (I/O) devices. A low voltage level (e.g., 1.2V) is used to power a core device such as a central processing unit (CPU). The mismatch between two voltage levels may cause a logic error. More particularly, an I/O buffer having an NMOS transistor and a PMOS transistor in series may receive an inadequate gate drive voltage signal from the output of a core device. Such an inadequate gate drive voltage signal causes an uncertain logic for transistors operating under high voltage level, the lower voltage from the output of a core device which partially turns on the NMOS transistor and partially turns off the PMOS transistor due to its inadequate voltage level. The simultaneous conduction of both the NMOS transistor and the PMOS transistor results in a large amount of leakage current. Such a large amount of leakage current may increase power consumption. Consequently, the battery life of a portable device may be significantly reduced.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, an integrated circuit operating on two supply potentials. The invention may also be applied, however, to a variety of integrated circuits operating on multiple supply potentials.

Figure 1A:
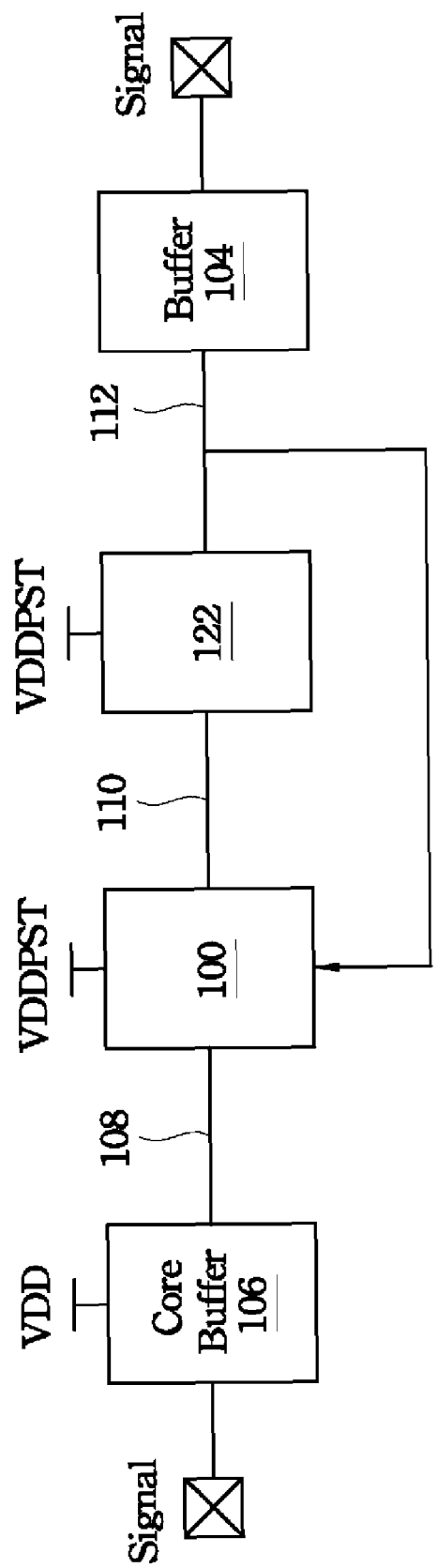
FIGS. 1A-1B illustrate a block diagram of an exemplified integrated circuit having a low leakage power detection circuit in accordance with an embodiment.

Referring initially to FIG. 1A, a block diagram of an exemplified integrated circuit having a low leakage power detection circuit is illustrated in accordance with an embodiment. The exemplified integrated circuit comprises a core buffer 106, a low leakage power detection circuit 100, a buffer 122, and an Input/Output (I/O) buffer 104. Both the buffer 122 and the low leakage power detection circuit 100 are supplied by a voltage potential VDDPST. The core buffer 106 is supplied by a voltage potential VDD. In accordance with an embodiment, VDDPST is a voltage for powering I/O circuits, which require a high supply potential (e.g, 3.3V). In contrast, VDD is a low supply potential (e.g., 1.2V) for driving core circuits. The core buffer 106 receives a control signal and generates a signal 108. The logic high state of the signal 108 is approximately equal to VDD because the core buffer 106 is supplied with VDD. The low leakage power detection circuit 100 receives the signal 108 from the core buffer 106 and a signal 112 from the output of the buffer 122, and then generates a signal 110 having a logic high state approximately equal to VDDPST. The buffer 122 receives the signal 110 and generates the signal 112. The I/O buffer 104 has an input connected to the signal 112.

Figure 1B:
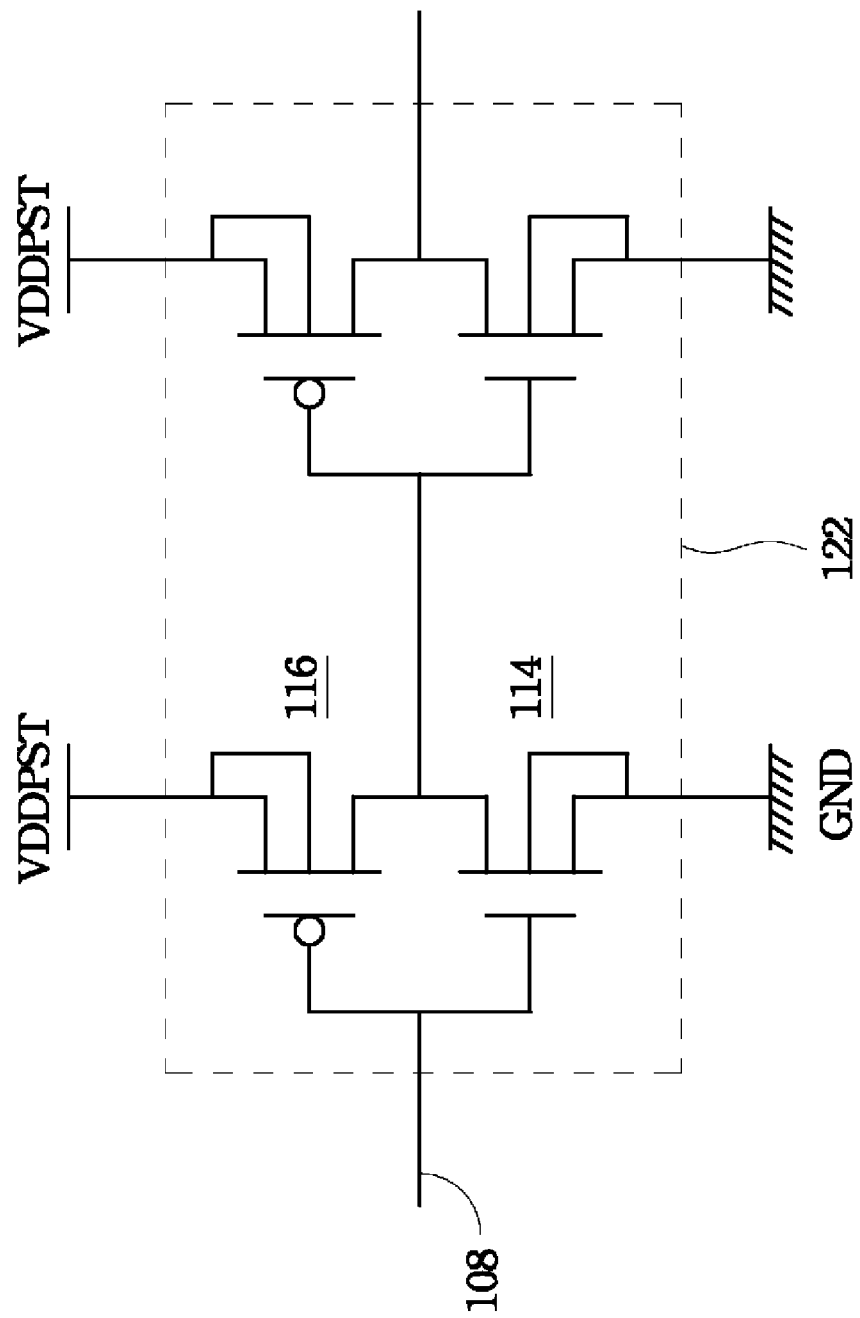

By employing the low leakage power detection circuit 100, the leakage current flowing through a high supply potential to a ground supply potential can be reduced. As shown in FIG. 1B, a P-type Metal Oxide Semiconductor (PMOS) transistor 116 and an N-type Metal Oxide Semiconductor (NMOS) transistor 114 connected in series form a stage of the buffer 122. It should be noted that while the buffer 122 in FIG. 1B includes two PMOS transistors and two NMOS transistors, the buffer 122 could accommodate any number of PMOS transistors and NMOS transistors. For example, a plurality of PMOS transistors may be connected in parallel first and then connected in series with a plurality of parallel-connected NMOS transistors. The number of transistors illustrated in FIG. 1B is limited solely for the purpose of clearly illustrating the inventive aspects of the various embodiments. The present invention is not limited to any specific number of transistors.

As shown in FIG. 1B, if the signal 108 is coupled to the input of the buffer 122 directly, the logic high state (e.g., 1.2V) of the signal 108 may not be high enough to turn off the PMOS transistor 116 because the PMOS transistor 116 is tied to a high voltage potential VDDPST (e.g., 3.3V). At the same time, the logic high state (e.g., 1.2V) of the signal 108 is capable of turning on the NMOS transistor 114. As a result, a leakage current flows through the path formed by the NMOS transistor 114 and the PMOS transistor 116. An advantageous feature of the low leakage power detection circuit 100 is that the leakage current flowing through the buffer 122 can be significantly reduced by employing the low leakage power detection circuit 100 between the core buffer 106 and the buffer 122. It should be noted that while FIG. 1B illustrates the input stage of the buffer 122, the low leakage power detection circuit 100 is applicable to other devices having a leakage current flowing between a high supply potential and a ground supply potential.

Referring to FIG. 1A again, the low leakage power detection circuit 100 is capable of converting a logic high state having a low voltage potential (e.g., 1.2V) to a logic high state having a high voltage potential (e.g., 3.3V). As shown in FIG. 1B, the PMOS transistor 116 is coupled to the high voltage potential VDDPST. The signal 110 generated from the low leakage power detection circuit 100 is capable of turning off the PMOS transistor 116 when the logic state of the signal 110 changes from low to high. The detailed operation of the low leakage power detection circuit 100 will be discussed below with respect to FIG. 3.

Figure 2:
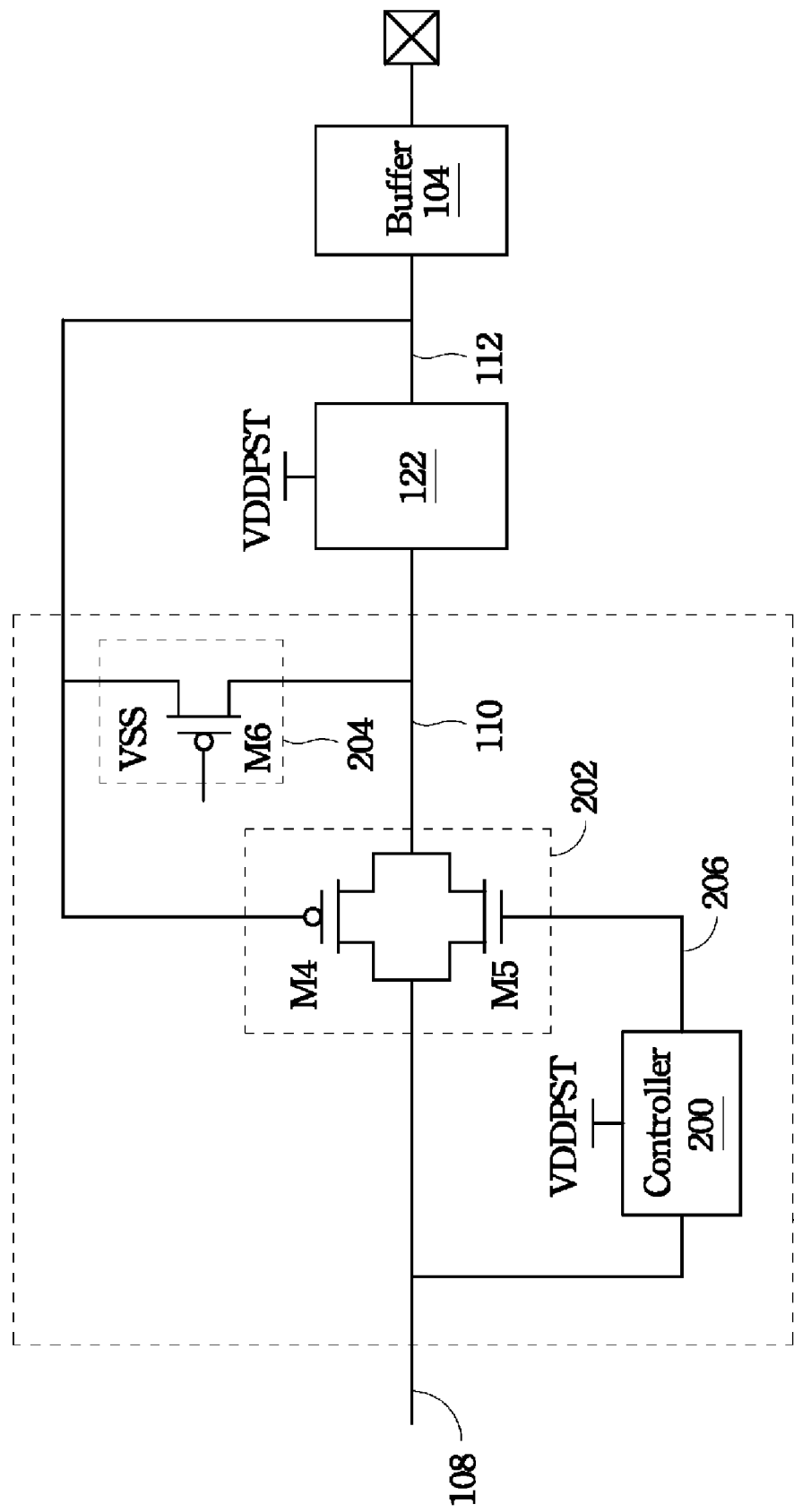
FIG. 2 illustrates a block diagram of the low leakage power detection circuit shown in FIG. 1A.

FIG. 2 illustrates a block diagram of the low leakage power detection circuit 100. The low leakage power detection circuit 100 comprises a controller 200, a transmission gate 202 and a feedback channel 204. The feedback channel 204 comprises a PMOS transistor M6 connected between the output and the input of the buffer 122. The gate of the PMOS transistor M6 is coupled to VSS, which is typically tied to ground. As shown in FIG. 2, the PMOS transistor M6 is always on and provides a feedback channel between the output and the input of the buffer 122.

As it is known in the art, the operation of the transmission gate 202 is not discussed in detail herein. The transmission gate 202 includes an NMOS transistor M5 and a PMOS transistor M4 connected in parallel. The PMOS transistor M4 and the NMOS transistor M5 form a signal switch having an input terminal connected to the signal 108 and an output terminal connected to the input of the buffer 122. The transmission gate 202 further comprises two gates receiving control signals. The gate of the PMOS transistor M4 is connected to the output of the buffer 122 and the gate of the NMOS transistor M5 is connected to the output of the controller 200. The controller 200 is biased by the high voltage potential VDDPST. The input of the controller 200 is connected to the signal 108.

In FIG. 2, the transmission gate 202 functions as a switch. In response to the control signals at the gate of the PMOS transistor M4 and the gate of the NMOS transistor M5, the transmission gate 202 may provide a channel allowing the signal 108 to pass through and reach the buffer 122. On the other hand, the transmission gate 202 may prevent the buffer 122 from receiving the signal 108 by turning off both the NMOS transistor M5 and the PMOS transistor M4. As shown in FIG. 2, the control signals of the transmission gate 202 is obtained from the output of the controller 200 and the output of the buffer 122 respectively. The operation principle of the controller 200 will be described in detail with respect to FIG. 3.

Figure 3:
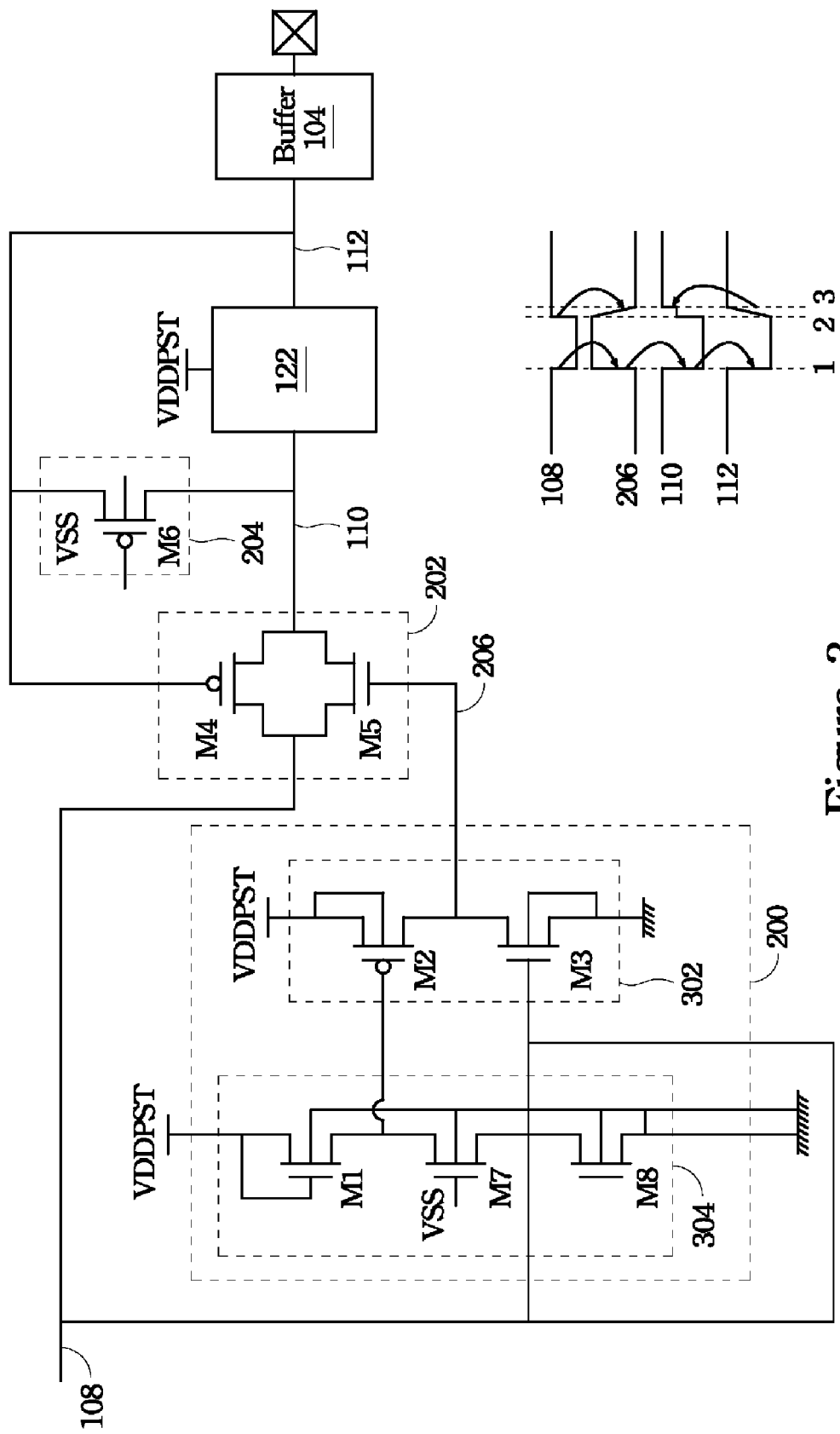
FIG. 3 illustrates the detailed block diagram of the controller shown in FIG. 2 and the operation of the low leakage power detection circuit.
Figure 3:
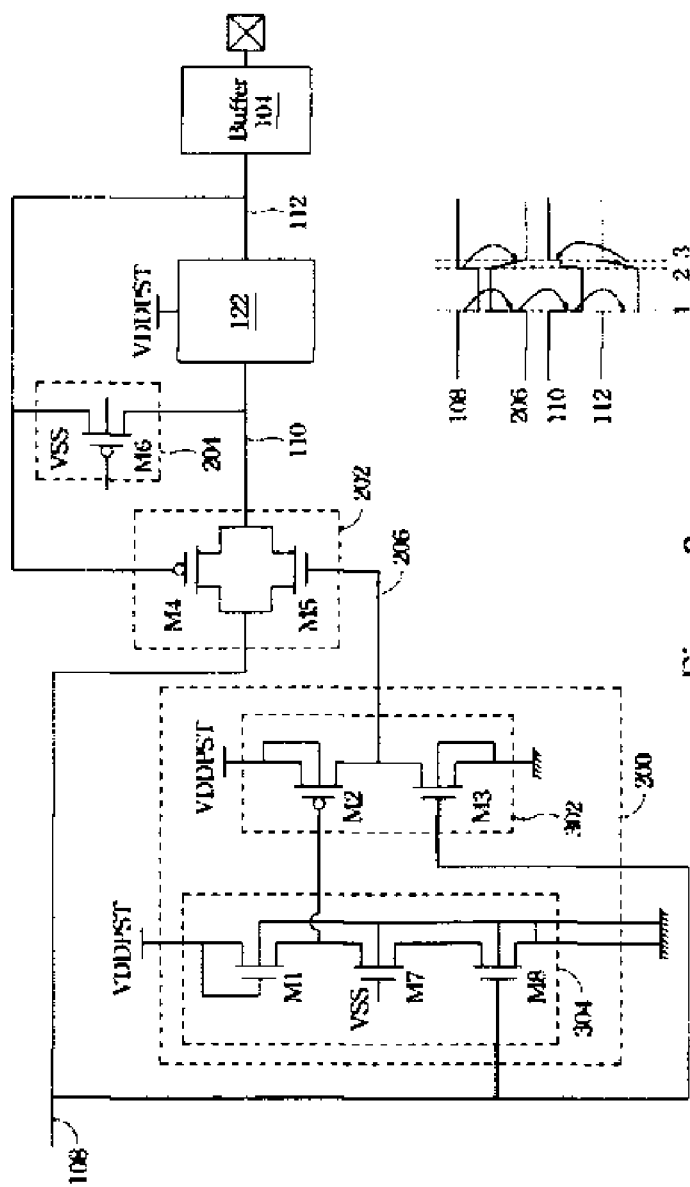
Figure 3:
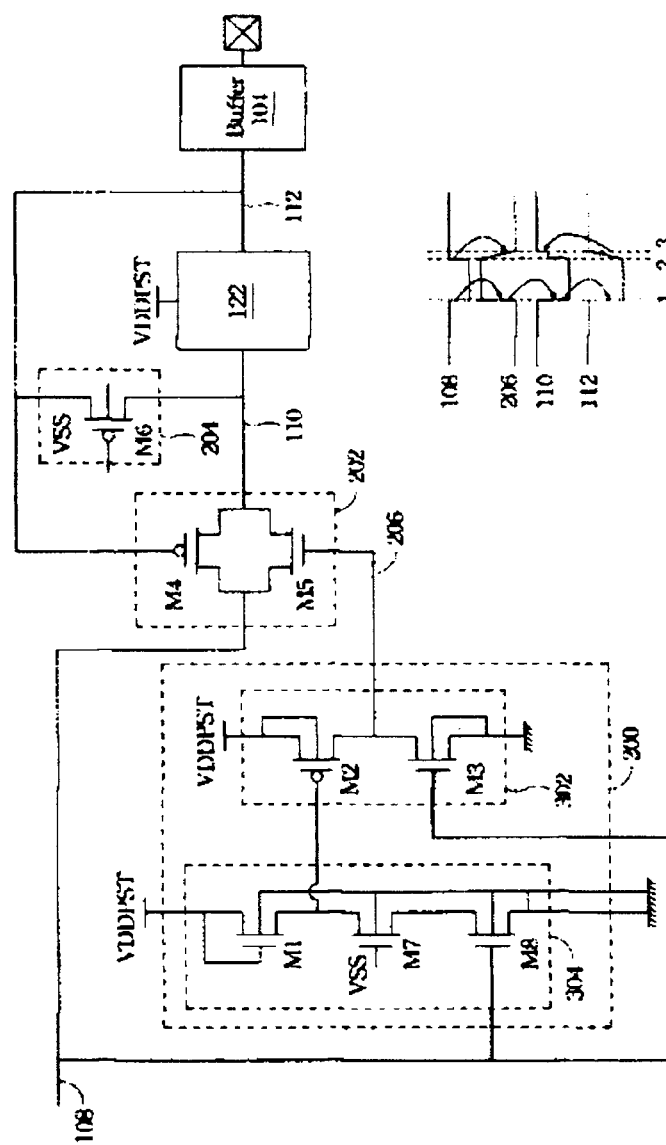

FIG. 3 further illustrates the detailed block diagram of the controller 200 shown in FIG. 2. The controller 200 includes a transmission gate control block 302 and a PMOS gate control block 304. The transmission gate control block 302 comprises a PMOS transistor M2 and an NMOS transistor M3. The PMOS transistor M2 and the NMOS transistor M3 are connected in series between VDDPST and ground. The connecting point between the PMOS transistor M2 and the NMOS transistor M3 is the output of the transmission gate control block 302. The gate of the NMOS transistor M3 is connected to the signal 108 and the gate of the PMOS transistor M2 is connected to the output of the PMOS gate control block 304. In sum, the transmission gate control block 302 generates a gate control signal for the transmission gate 202.

The PMOS gate control block 304 comprises three NMOS transistors, namely M1, M7 and M8 in series connection. The NMOS transistor M1 has a drain connected to VDDPST, a gate tied to the drain and a source connected to the drain of the NMOS transistor M7. The NMOS transistor M7 is a native NMOS transistor having a gate connected to VSS and a source connected to the drain of the NMOS transistor M8. The NMOS transistor M8 has a gate connected to the signal 108 and a source connected to ground. The connecting point between the NMOS transistor M1 and the NMOS transistor M7 is the output of the PMOS gate control block 304. The output of the PMOS gate control block 304 may provide a voltage drop for driving the PMOS transistor M2. In summary, the transmission gate control block 302 and the PMOS gate control block 304 form the controller 200. In response to the logic state change of the signal 108, the controller 200 generates a gate signal to control the on/off of the NMOS transistor M5 accordingly. It should be noted that while the transmission gate control block 302 comprises one NMOS and one PMOS in series, and the PMOS gate control block 304 comprises three NMOS transistors in series, the number of transistors illustrated herein is limited solely for the purpose of clearly illustrating the inventive aspects of the various embodiments. One of ordinary skill in the art would recognize many variations, alternatives and modifications.

FIG. 3 further illustrates the operation of the low leakage power detection circuit 100. Signals 108, 206, 110 and 112 are selected to illustrate the operation of the low leakage power detection circuit 100. As shown in FIG. 3, assume that the signal 108 starts from a logic high state. It should be noted that the logic high state of the signal 108 has a low voltage potential (e.g., 1.2V) because the signal 108 is generated from the core buffer 106 (not shown but illustrated in FIG. 1A), which is supplied with VDD having a low voltage potential.

When a falling edge of the signal 108 occurs at a first time instance labeled by a dashed line 1, in response to the logic state change of the signal 108 from a logic high state to a logic low state, NMOS transistors M3 and M8 are turned off. As a result, VDDPST charges the gate of the NMOS transistor M5 (illustrated by the waveform 206) via the PMOS transistor M2, and hence the NMOS transistor M5 is turned on. Consequently, the logic low state of the signal 108 is transferred to the input of the buffer 122, which is referred to as the signal 110. At the time instance 1, the waveform 110 shows the logic state changes from a logic high to a logic low. The logic low state at the signal 110 determines the output of the buffer 122 (referred to as the signal 112) is low as well (See the waveform 112 at the time instance 1). The logic low state at the signal 112 further turns on the PMOS transistor M4. The turn-on of both the NMOS transistor M5 and the PMOS transistor M4 makes the transmission gate 202 function as a turned-on switch allowing the signal 108 to reach the input of the buffer 122. The logic low state of the signal 108 may not cause a leakage current flowing through the buffer 122 because the logic low state can turn off the NMOS transistor 114 (not shown but illustrated in FIG. 1B).

On the other hand, when a rising edge of the signal 108 occurs at a second time instance labeled by a dashed line 2, in response to the logic state change of the signal 108, the NMOS transistor M3 is turned on. The gate of the NMOS transistor M5 will be not fully discharged until a third time instance labeled by a dashed line 3. The gate of the PMOS transistor M4 is fully turned on at this instance. During the period between the dashed line 2 and the dashed line 3, the NMOS transistor M5 remains on and the logic high state of the signal 108 is transferred to the input of the buffer 122 via the NMOS transistor M5 and the PMOS transistor M4. As shown in the waveform 110, the amplitude of the signal 110 during the period between the dashed line 2 and the dashed line 3 is equal to the low voltage potential (e.g., 1.2). Such low voltage potential at the input of the buffer 122 may not be high enough to turn off the PMOS transistor 116 (not shown but illustrated in FIG. 1B). However, the logic high state of the signal is capable of turning on the NMOS transistor 114 (not shown but illustrated in FIG. 1B) in the buffer 122. The turn-on of the NMOS transistor 114 of the buffer 122 generates a logic low state. Such a logic low state may result in a logic high state at the output of the buffer 122. In response to the logic high state at the buffer 122, the signal 112 has a voltage amplitude approximately equal to VDDPST (See the waveform 112 changes from a logic low to logic high during the period between the dashed line 2 and the dashed line 3). After the logic high state at the signal 112 is fully established, the logic high having a VDDPST voltage amplitude is transferred to the signal 110 via the feedback channel 204. As shown in FIG. 3, the waveform 110 shows the voltage at the signal 110 jumps from a low voltage potential equal to VDD to a high voltage potential equal to VDDPST when the waveform 112 changes from a logic low state to a logic high state. Such a jump helps to fully turn off the PMOS transistor 116 (not shown) in the buffer 122. As a result, the leakage current through a simultaneous turn-on of the NMOS 114 and the PMOS transistor 116 (not shown) of the buffer 122 is avoided. The signal 112 having a high voltage potential equal to VDDPST also turns off the gate of the PMOS transistor M4. After the transistors M4 and M5 are fully turned off, the leakage current from a high voltage potential at the signal 110 to a low voltage potential at the signal 108 can be avoided.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

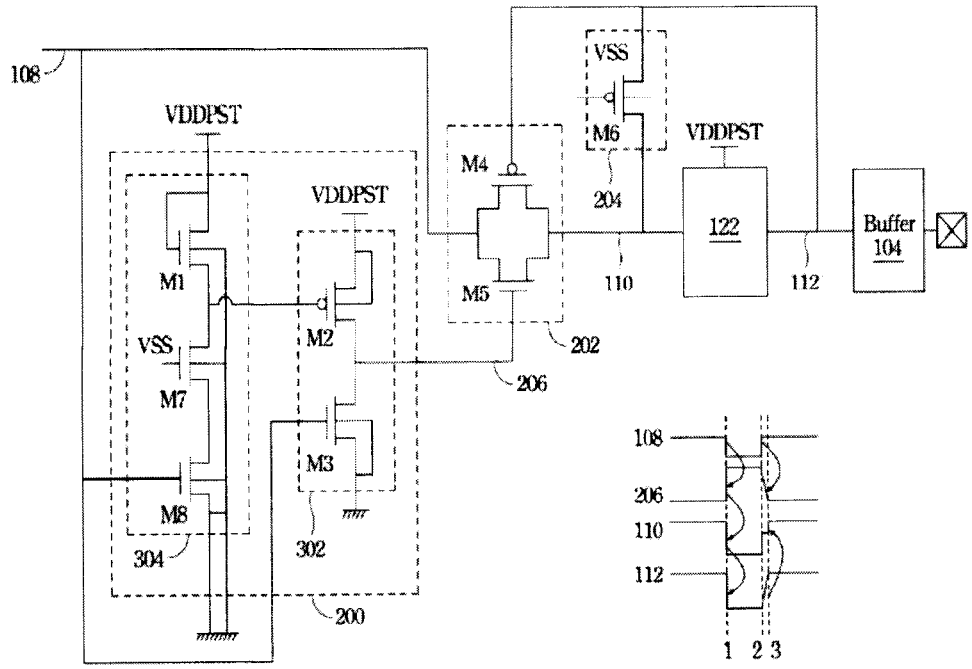

What is claimed is:

1. An apparatus comprising:
    a first switch comprising:
        a first control terminal connected to an output of a controller;
        a second control terminal coupled to an output of a buffer;
        a first terminal connected to receive a signal, the signal having a logic high state with an amplitude equal to a low voltage potential; and
        a second terminal being configured to generate a logic high state having an amplitude equal to a high voltage potential, wherein the second terminal is coupled to an input of the buffer;
    a second switch coupled between the output of the buffer and the input of the buffer; and
    the controller being configured to receive the signal.

2. The apparatus of claim 1, wherein the first switch is a transmission gate.

3. The apparatus of claim 1, wherein the second switch is a P-type Metal Oxide Semiconductor (PMOS) transistor having a gate connected to ground.

4. The apparatus of claim 1, wherein the controller is supplied with the high voltage potential.

5. The apparatus of claim 1, wherein the first switch is configured such that:
    the first switch is turned on when the signal has a logic low state; and
    the first switch remains on until the output of the buffer generates a logic high state with the high voltage potential.

6. The apparatus of claim 1, wherein the first switch is configured to be turned off after allowing a previous logic state of the signal being transferred to the input of the buffer when the signal changes from a logic low state to a logic high state.

7. The apparatus of claim 1, wherein the second switch is configured to be turned on so that the input of the buffer is coupled to the output of the buffer.

8. The apparatus of claim 1, wherein the controller further comprises a first block having a first PMOS transistor and a first NMOS transistor in series generating the output of the controller and a second block having a second NMOS transistor, a third NMOS transistor and a fourth NMOS transistor in series generating a voltage drop for driving the first PMOS transistor.

9. A system comprising:
    a core buffer receiving an input signal and generating a signal having a logic high state having an amplitude equal to a low voltage potential;
    a low leakage power detection circuit comprising:
        a first switch comprising:
            a first control terminal connected to an output of a controller;
            a second control terminal coupled to an output of a buffer;
            a first terminal connected to a signal having a logic high state having an amplitude equal to a low voltage potential; and
            a second terminal being configured to generate a logic high state having an amplitude equal to a high voltage potential, wherein the second terminal is coupled to an input of the buffer;
        a second switch coupled between the output of the buffer and the input of the buffer; and
        the controller being configured to receive the signal;
    the buffer having an input stage comprising at least one P-type Metal Oxide Semiconductor (PMOS) transistor and one N-type Metal Oxide Semiconductor (NMOS) transistor in series.

10. The system of claim 9, wherein the buffer comprises one more pair of PMOS transistor and NMOS transistor.

11. The system of claim 9, wherein the buffer is supplied with the high voltage potential.

12. The system of claim 9, wherein the core buffer is supplied with the low voltage potential.

13. The system of claim 9, further comprising a second buffer coupled to the output of the buffer.

14. The system of claim 9, wherein the low leakage power detection circuit is configured to generate a logic high state having an amplitude equal to the high voltage potential after the low leakage power detection circuit receives a logic high state having an amplitude equal to the low voltage potential.

15. The system of claim 14, further comprising a delay between receiving the logic high state having an amplitude equal to the low voltage potential and generating the logic high state having an ground amplitude equal to the high voltage potential.

16. A method comprising:
 providing a first digital signal to a core buffer supplied with a low voltage potential;
 generating a second digital signal with a logic high state having an amplitude equal to the low voltage potential;
 sending the logic high state having an amplitude equal to the low voltage potential to an input of a buffer via a first switch coupled between the core buffer and the buffer;
 turning off the first switch;
 connecting an output of the buffer to the input of the buffer via a second switch; and
 converting the logic high state having an amplitude equal to the low voltage potential to a logic high state having an amplitude equal to a high voltage potential at the input of the buffer.

17. The method of claim 16, further comprising providing a control signal, after a delay, to turn off the first switch when the second digital signal changes from a logic low state to a logic high state.

18. The method of claim 17, wherein the delay is a period during which the first switch is turned off.

19. The method of claim 16, further comprising:
 generating a control signal at a first junction point between a first PMOS transistor and a first NMOS transistor;
 sending the control signal to a first control terminal of the first switch;
 generating a PMOS control signal at a second junction point between a second NMOS transistor and a third NMOS transistor; and
 sending the PMOS control signal to a gate of the first PMOS transistor.

20. The method of claim 16, wherein the first switch is a transmission gate and the second switch is a PMOS transistor.

\* \* \* \* \*

UNITED STATES PATENT AND TRADEMARK OFFICE
CERTIFICATE OF CORRECTION

| | |
|---|---|
| PATENT NO. | : 8,207,755 B1 |
| APPLICATION NO. | : 13/027419 |
| DATED | : June 26, 2012 |
| INVENTOR(S) | : Wang |

It is certified that error appears in the above-identified patent and that said Letters Patent is hereby corrected as shown below:

In the Drawings

Drawing Sheet 4 of 4, FIG. 3 should be displayed as follows:

Signed and Sealed this
Eleventh Day of November, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,207,755 B1 | Page 1 of 3 |
| APPLICATION NO. | : 13/027419 | |
| DATED | : June 26, 2012 | |
| INVENTOR(S) | : Wang | |

It is certified that error appears in the above-identified patent and that said Letters Patent is hereby corrected as shown below:

The Title page, showing the illustrative figure, should be deleted and substitute therefor the attached Title page.

In the Drawings

Drawing Sheet 4 of 4, FIG. 3 should be displayed as follows:

This certificate supersedes the Certificate of Correction issued November 11, 2014.

Signed and Sealed this
Sixteenth Day of December, 2014

Michelle K. Lee
*Deputy Director of the United States Patent and Trademark Office*

(12) United States Patent
Wang

(10) Patent No.: US 8,207,755 B1
(45) Date of Patent: Jun. 26, 2012

(54) LOW LEAKAGE POWER DETECTION CIRCUIT

(75) Inventor: Wen-Han Wang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/027,419

(22) Filed: Feb. 15, 2011

(51) Int. Cl.
*H03K 19/094* (2006.01)

(52) U.S. Cl. .............................. 326/81; 326/27; 326/68

(58) Field of Classification Search ............... 326/21, 326/26–28, 63, 68, 70, 71, 80–82
See application file for complete search history.

(56) References Cited

U.S. PATENT DOCUMENTS

| | | | | |
|---|---|---|---|---|
| 5,828,231 | A * | 10/1998 | Bazargan | 326/81 |
| 6,897,688 | B2 * | 5/2005 | Lee et al. | 327/112 |
| 7,560,971 | B2 | 7/2009 | Heikkila et al. | |
| 2002/0033703 | A1 * | 3/2002 | Yu et al. | 324/551 |
| 2007/0139096 | A1 * | 6/2007 | Kim et al. | 327/525 |
| 2008/0084775 | A1 * | 4/2008 | Hoberman et al. | 365/227 |
| 2009/0295770 | A1 * | 12/2009 | Woo et al. | 345/208 |

* cited by examiner

*Primary Examiner* — Don Le
(74) *Attorney, Agent, or Firm* — Slater & Matsil, L.L.P.

(57) ABSTRACT

A leakage current reduction circuit comprising a transmission gate, a feedback channel and a controller is placed between a first device supplied with a first voltage potential and a second device supplied with a second voltage potential. The voltage potential mismatch between the first device and the second device may cause a leakage current flowing through the input stage of the second device. By employing the low leakage power detection circuit, a logic high state generated from the first device can be converted into a logic high state having an amplitude approximately equal to the second voltage potential.

20 Claims, 4 Drawing Sheets